US011404415B2

(12) United States Patent
Li et al.

(10) Patent No.: US 11,404,415 B2
(45) Date of Patent: Aug. 2, 2022

(54) STACKED-GATE TRANSISTORS

(71) Applicant: GLOBALFOUNDRIES U.S. INC., Santa Clara, CA (US)

(72) Inventors: Wenjun Li, Saratoga Springs, NY (US); Brian J. Greene, Portland, OR (US); Tao Chu, Portland, OR (US); Bingwu Liu, Clifton Park, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 128 days.

(21) Appl. No.: 16/503,982

(22) Filed: Jul. 5, 2019

(65) Prior Publication Data

US 2021/0005605 A1    Jan. 7, 2021

(51) Int. Cl.
*H01L 27/092* (2006.01)
*H01L 27/088* (2006.01)
*H01L 27/02* (2006.01)

(52) U.S. Cl.
CPC ...... *H01L 27/0924* (2013.01); *H01L 27/0207* (2013.01); *H01L 27/0886* (2013.01)

(58) Field of Classification Search
CPC ............. H01L 27/0924; H01L 27/0207; H01L 27/0886
See application file for complete search history.

(56) References Cited

U.S. PATENT DOCUMENTS

| 6,784,933 B1* | 8/2004 | Nakai | H01L 27/115 257/291 |
|---|---|---|---|
| 2006/0244041 A1* | 11/2006 | Tanaka | H01L 27/11529 257/315 |
| 2007/0045736 A1 | 3/2007 | Yagishita | |
| 2009/0261398 A1* | 10/2009 | Chien | G11C 16/0483 257/316 |
| 2012/0299098 A1* | 11/2012 | Liu | H01L 29/7923 257/347 |
| 2015/0255461 A1 | 9/2015 | Reddy et al. | |
| 2016/0064398 A1* | 3/2016 | Toh | H01L 29/66825 257/316 |
| 2016/0284707 A1 | 9/2016 | Okagaki | |
| 2017/0345828 A1* | 11/2017 | Wu | G11C 7/14 |
| 2018/0047738 A1* | 2/2018 | Richter | H01L 27/11546 |

FOREIGN PATENT DOCUMENTS

TW    201131786    9/2011

OTHER PUBLICATIONS

Taiwanese Office Action and Search Report in related TW Application No. 109118808 dated Jul. 22, 2021, 20 pages.
Taiwanese Notice of Allowance in related TW Application No. 109118808 dated Feb. 25, 2022, 4 pages.

* cited by examiner

*Primary Examiner* — Sitaramarao S Yechuri
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to stacked gate transistors and methods of manufacture. The structure includes a stacked gate structure having a plurality of transistors with at least one floating node and at least one node to either ground or a supply voltage, and a contact to either of the ground or supply voltage and the at least one floating node being devoid of any contact.

19 Claims, 2 Drawing Sheets

STACKED-GATE TRANSISTORS

FIELD OF THE INVENTION

The present disclosure relates to semiconductor structures and, more particularly, to stacked gate transistors and methods of manufacture.

BACKGROUND

Transistor stacks include nodes to a supply and ground, in addition to floating nodes. The floating nodes are signal lines that are not actively forced to a defined high level or low level. In a high-impedance state, the charge (or lack of charge) is trapped at the node with no path to supply or ground voltages. The contacts to the floating nodes are thought to decrease contact resistance and increase capacitance of the device.

SUMMARY

In an aspect of the disclosure, a structure comprises a stacked gate structure comprising a plurality of transistors with at least one floating node and at least one node to either ground or a supply voltage, and a contact to either of the ground or supply voltage and the at least one floating node being devoid of any contact.

In an aspect of the disclosure, a structure comprises: multiple FET devices connected in series, including a first FET having a diffusion region and a last FET device having a diffusion region; a first contact to the diffusion region of the first FET and a second contact to the diffusion region of the last FET; and at least one floating diffusion region between the multiple FET devices, the at least one floating diffusion region being devoid of contacts.

In an aspect of the disclosure, a structure comprises: a first FET having an epitaxial diffusion region connecting to a voltage supply; a second FET having an epitaxial diffusion region connected to ground; at least one additional FET connecting in series with the first FET and the second FET and having a floating node devoid of any contacts; a first contact connecting the epitaxial diffusion region of the first FET to the voltage supply; and a second contact connecting the epitaxial diffusion region of the second FET to the voltage supply.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to stacked gate transistors and methods of manufacture. More specifically, the present disclosure is directed to stacked-gate field effect transistors (FETs) with floating nodes devoid of contacts (e.g., trench silicide and trench contact) and methods of manufacture. Advantageously, the present disclosure provides improved stacked-gate FET performance with improved resistance and capacitance performance. More specifically and unexpectedly, the removal of contacts for the floating nodes improves device DC performance from $R_{ON}$ reduction. This benefit also increases with the number of gates provided in the stack-gate FET.

In conventional stacked-FET devices, each of the floating nodes includes trench silicide and trench contacts. It has been found that the contacts are unnecessary for wiring which degrades device performance. For example, the contacts that land on epitaxial material (e.g., source and drain regions) cause parasitic resistance from gouging and additional capacitance due to contact-transistor capacitor. Accordingly, it has been found that the contacts for floating nodes cause additional R and C penalty and hurt device performance. The contacts also have been found to release stress for PFET. The structures described herein eliminate these issues.

In more specific embodiments, the stacked-gate structure includes metal contacts to only the VDD node and GND node, and no contacts to any of the floating nodes. In this structure, multiple FET devices are connected in series, including a first FET device and a last FET device. The first FET device and the last FET device can be at opposite ends of the series. Contacts (e.g., trench silicide and trench contact) are above and in contact with the source/drain regions of the first FET and last FET devices, respectively, with contacts in-between the first and second contacts.

The stacked gate transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the stacked gate transistors of the present disclosure have been adopted from integrated circuit (IC) technology. For example, the structures are built on wafers and are realized in films of material patterned by photolithographic processes on the top of a wafer. In particular, the fabrication of the stacked gate transistors uses three basic building blocks: (i) deposition of thin films of material on a substrate, (ii) applying a patterned mask on top of the films by photolithographic imaging, and (iii) etching the films selectively to the mask.

Figure 1A:
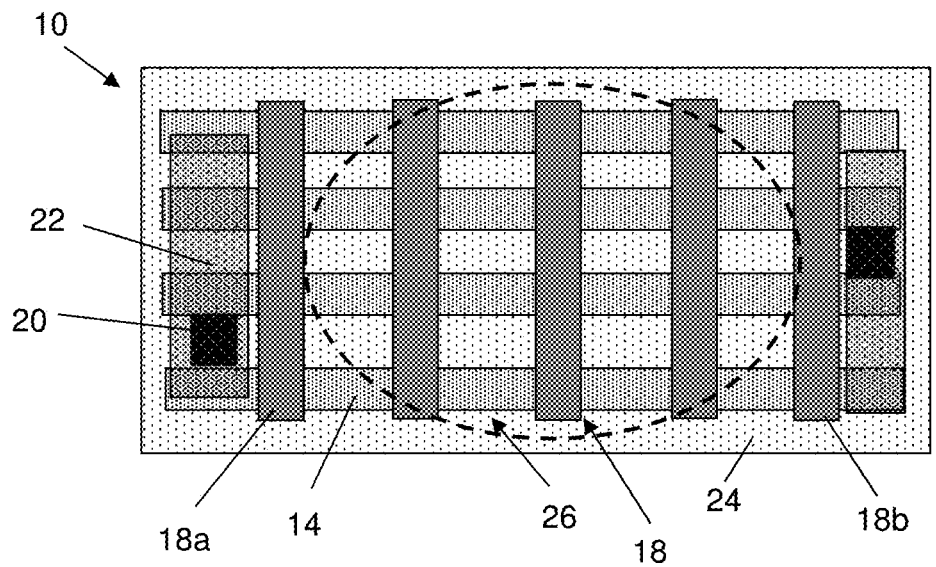
FIG. 1A shows a top view of stacked-gate transistors, amongst other features, and respective fabrication processes in accordance with aspects of the present disclosure.
Figure 1B:
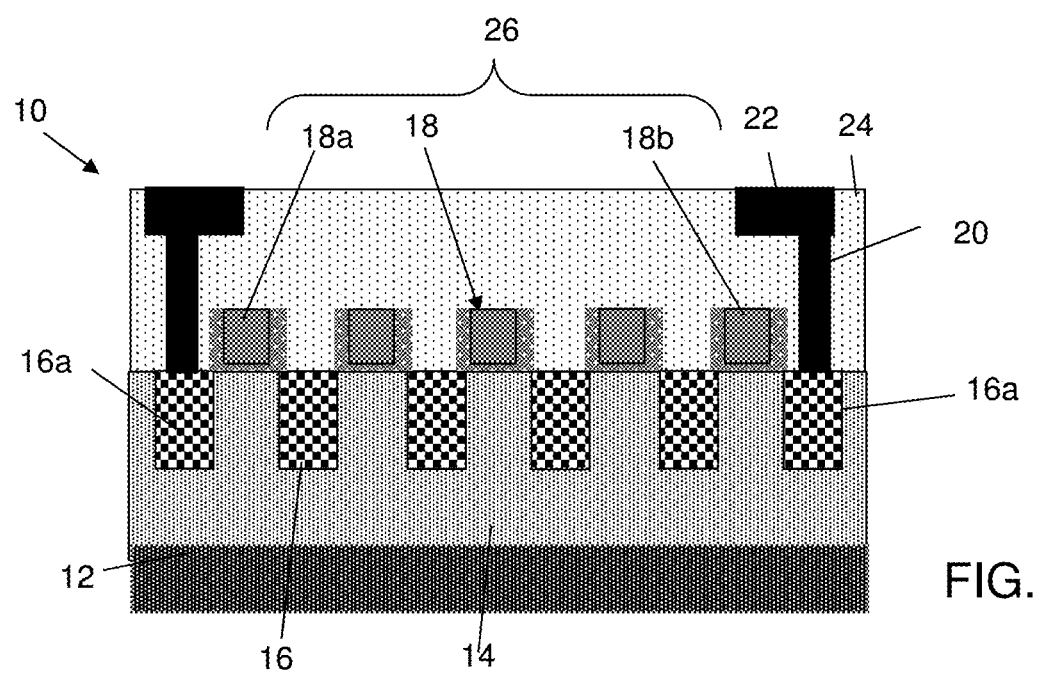
FIG. 1B shows a side cut-away view of the stacked-gate transistors of FIG. 1A.

FIG. 1A shows a top view of stacked-gate transistors, amongst other features, and respective fabrication processes in accordance with aspects of the present disclosure. FIG. 1B shows a side cut-away view of the stacked-gate transistors of FIG. 1A. Referring to both FIGS. 1A and 1B, the structure 10 includes a substrate 14 on an insulator material 12. In embodiments, the substrate 14 can be semiconductor on insulator (SOI) technology. The substrate 14 can be composed of any suitable material including, but not limited to, Si, SiGe, SiGeC, SiC, GaAs, InAs, InP, and other III/V or II/VI compound semiconductors.

The substrate 14 can be representative of one or more fin structures. The fin structures 14 can be formed using conventional sidewall image transfer (SIT) techniques. In the SIT technique, for example, a mandrel material, e.g., $SiO_2$, is deposited on the substrate 14, using conventional CVD processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions between narrow fin structures and/or wide fin structures. Spacers are formed on the sidewalls of the mandrels which are preferably material that is different than the mandrels, and which are formed using conventional deposition processes known to those of skill in the art. The spacers can have a width which matches the dimensions of the fin structures 14, for example. The mandrels are removed or stripped using a conventional etching process, selective to the mandrel material. An etching is then performed within the spacing of the spacers to form the sub-lithographic features. The sidewall spacers can then be stripped. In embodiments, the wide fin structures can also be formed during this or other patterning processes, or through other conventional patterning processes, as contemplated by the present disclosure.

Still referring to FIGS. 1A and 1B, gate structures 18 are formed over the substrate (e.g., fins) 14. In embodiments, the gate structures 18 are finFETs formed by any known gate fabrication process, i.e., first gate process or replacement gate process. In embodiments, the gate structures 18 are stacked-gate structure, e.g., multiple FET devices, connected in series, including a first FET device 18a and a last FET device 18b. The first FET device 18a and the last FET device 18b can be at opposite ends of the series, which are connected to Vdd (supply node) and GND.

The gate structures 18 can be composed of a gate-dielectric material (e.g., high-k dielectric material), work-function metals and sidewall spacers (e.g., oxide or nitride). In the first gate process, the gate dielectric and workfunction metals (or poly) can be deposited using any conventional deposition methods, e.g., chemical vapor deposition (CVD), plasma enhanced CVD (PECVD), etc. Following the deposition of the materials, the materials can be subjected to a patterning process using conventional lithography and etching (RIE) processes. For the sidewall spacers, after deposition of the material over the patterned gate structures, an anisotropic etching process can be utilized to remove the sidewall spacer material from the substrate 14 and top of the gate structures 18.

Still referring to FIGS. 1A and 1B, diffusions 16, e.g., source and drain regions, are formed in the substrate 14 for each of the gate structures 18. Diffusions 16a are for Vdd node and GND node. In embodiments, the diffusions 16 can be formed by conventional ion implantation processes known by those of ordinary skill in the art such that no further explanation is required for a complete understanding of the present disclosure. In alternative embodiments, the diffusions 16 can be raised source and drain regions formed by a doped epitaxial growth process as is known by those of ordinary skill in the art such that no further explanation is required for a complete understanding of the present disclosure.

Contacts 20 and wiring structures 22 are formed to Vdd (voltage supply) and GND nodes 16a. In embodiments, the remaining nodes are floating nodes 26 which are devoid of any contacts. It has been obvious to have more metal contacts to the floating nodes to reduce contact resistance, but unexpectedly, it has now been found that the increase in metal contacts actually degrade stacked-FETs performance due to gouging and channel stress release. Hence, by eliminating the metal contacts (e.g., trench silicide and trench contact) on the floating nodes 26, the stacked FETs exhibit improved resistance and capacitance performance, i.e., improved device DC performance from $R_{ON}$ reduction. This benefit, unexpectedly, increases with the number of stacked-gates provided in the stack-gate FET.

In embodiments, the contacts 20 and wiring structures 22 are formed in dielectric material 24. The contacts 20 and wiring structures 22 (to Vdd and GND nodes 16a) are formed by using conventional lithography, etching and deposition processes. For example, following the deposition of the dielectric material 24, trenches are formed in the dielectric material 24 to expose the diffusions for the Vdd node and GND node. Metal material, e.g., tungsten, cobalt, etc. is then deposited within the vias, followed by a planarization process. The contacts 20 and wiring structures 22 can be formed by separate single damascene processes or a dual damascene process.

The contacts 20 can be formed on silicide regions formed on the diffusions 16. As should be understood by those of skill in the art, the silicide process begins with deposition of a thin transition metal layer, e.g., nickel, cobalt or titanium, over fully formed and patterned semiconductor devices (e.g., doped or ion implanted source and drain regions). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 20 in the active regions of the device. It should be understood by those of skill in the art that silicide contacts will not be required on the devices, when a gate structure is composed of a metal material.

Figures 2A, 2B:
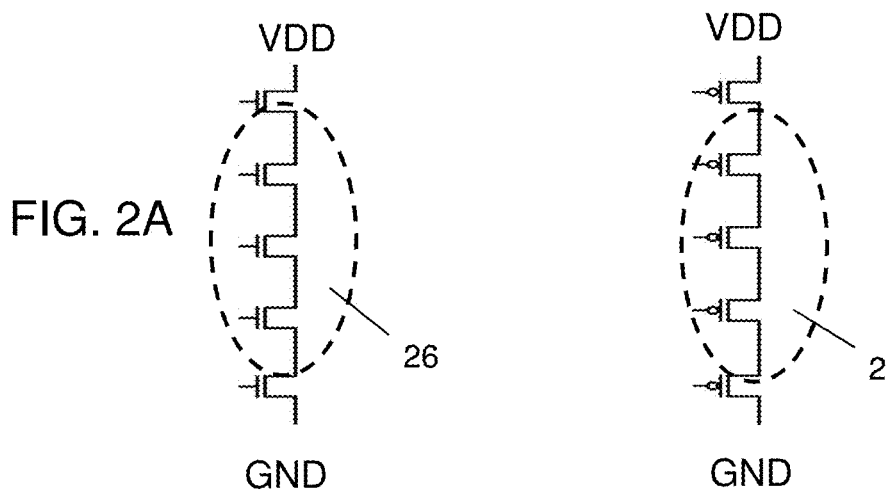
FIG. 2A shows an electrical schematic diagram of stacked NFETs in accordance with aspects of the present disclosure.
FIG. 2B shows an electrical schematic diagram of stacked PFETs in accordance with aspects of the present disclosure.

FIG. 2A shows an electrical schematic diagram of stacked NFETs; whereas FIG. 2B shows an electrical schematic diagram of stacked PFETs. In both of these scenarios, the floating nodes 26 are devoid of any contacts. Instead, only contacts are provided to the Vdd node and the GND node.

Figure 3:
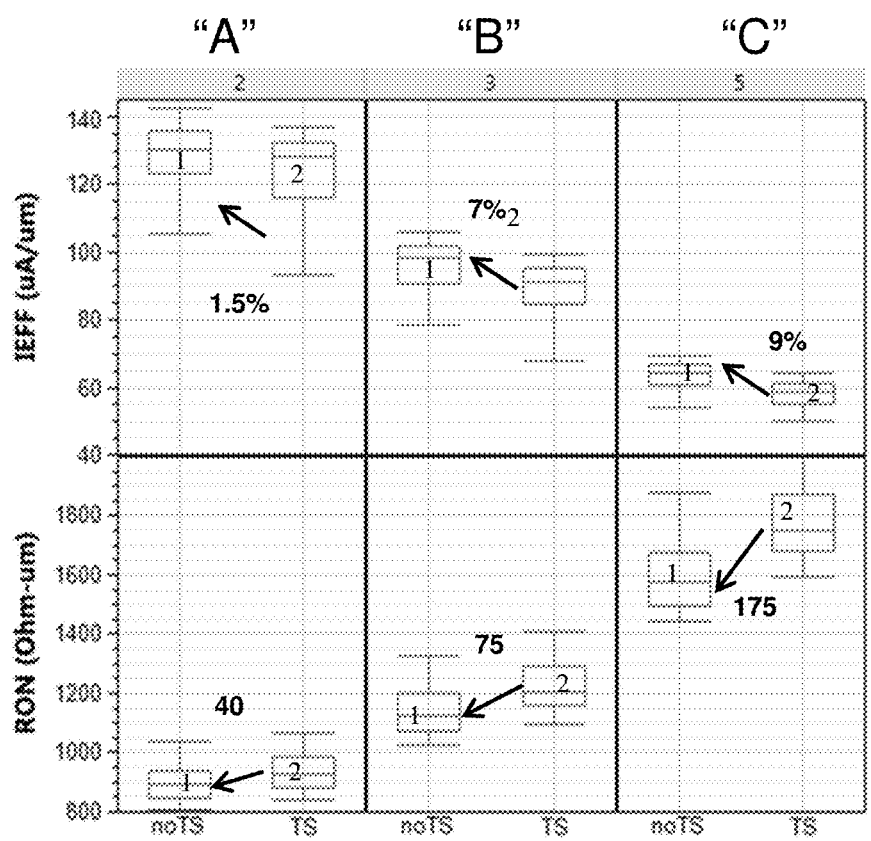
FIG. 3 shows a comparison graph comparing the structures described herein and a conventional device with contacts to floating nodes.

FIG. 3 shows a comparison graph comparing the structures described herein and a conventional device with contacts to floating nodes. In the graph of FIG. 3, the lower half of the "y" axis represents Ron (Ohm-µm) and the upper half of the "y" axis represents Ieff (effective current) (µA/µm). The "x" axis is segmented into three columns denoted by the number of transistors, 2, 3 and 5. For example, a first section ("A") represents two stacked transistors with a single floating node, a second section ("B") represents three stacked transistors with two floating nodes and a third section ("C") represents five stacked transistors with four floating nodes. In each of the segments, the boxes designated with reference numeral "1" represent the structures with no contacts to the floating nodes and the boxes designated with reference numeral "2" represent the structures with contacts to the floating nodes.

Referencing to the upper half of the graph of FIG. 3, in column "A", it is shown that there is a 1.5% improvement in Ieff for the device with no contacts to floating nodes. In column "B", it is shown that there is a 7.0% improvement in Ieff for the device with no contacts to floating nodes. In column "C", it is shown that there is a 9.0% improvement in Ieff for the device with no contacts to floating nodes. Accordingly, it is graphically shown that there is greater improvement in Ieff as the number of stacked transistors is increased, with each case providing improvement over the conventional devices with contacts to each of the floating nodes.

Referencing to the lower half of the graph of FIG. 3, in column "A", it is shown that there is a 40 Ohm-µm improvement in Ron for the device with no contacts to floating nodes. In column "B", it is shown that there is a 75 Ohm-μm improvement in Ron for the device with no contacts to floating nodes. In column "C", it is shown that there is a 175 Ohm-μm improvement in Ron for the device with no contacts to floating nodes. Accordingly, it is graphically shown that there is greater improvement in Ron as the number of stacked transistors is increased, with each case providing improvement over the conventional devices with contacts to each of the floating nodes The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a stacked gate structure comprising a plurality of transistors comprising, in series, a first transistor, a last transistor, and at least one middle transistor between the first transistor and the last transistor;
the first transistor comprising one node connected to ground by a first contact;
the last transistor comprising one node connected to a supply voltage by a second contact;
each of the at least one middle transistor comprising two floating diffusion regions devoid of any contacts.

2. The structure of claim 1, wherein the two floating diffusion regions comprise-diffusion regions.

3. The structure of claim 2, wherein the diffusion regions comprise doped epitaxial region.

4. The structure of claim 1, wherein the node for the supply voltage and the node for the ground are diffusion regions.

5. The structure of claim 1, wherein the transistors are NFETs in series.

6. The structure of claim 1, wherein the transistors are PFETs in series.

7. The structure of claim 1, wherein the two floating diffusion regions, the node to ground and the node to the supply voltage are provided in a fin composed of substrate material.

8. The structure of claim 1, wherein the two floating nodes are devoid of trench silicide and trench contacts, and first contact and the second contact are the only metal contacts to the ground and the supply voltage.

9. A structure comprising:
multiple FET devices connected in series, including a first FET having a diffusion region, a last FET device having a diffusion region, and at least one middle FET between the first FET and the last FET, each of the at least one middle FET including floating diffusion regions;
a first contact to the diffusion region of the first FET and a second contact to the diffusion region of the last FET, wherein
each of the floating diffusion regions are devoid of contacts between the first contact and the second contact.

10. The structure of claim 9, wherein the diffusion regions of the first FET and the second FET and the floating diffusions regions are raised epitaxial material.

11. The structure of claim 10, wherein the raised epitaxial material are raised source and drain regions.

12. The structure of claim 10, wherein the first FET device and the last FET are at opposite ends of the series.

13. The structure of claim 12, wherein the first contact to the diffusion region of the first FET connects to a voltage supply and the second contact to the diffusion region of the last FET connects to ground.

14. The structure of claim 13, wherein the floating diffusion regions are multiple floating nodes in series, between the first FET and the last FET, each of which are devoid of the contacts.

15. The structure of claim 14, wherein the multiple floating nodes are associated with multiple respective middle transistors.

16. The structure of claim 9, wherein the multiple FET devices are finFET devices.

17. The structure of claim 16, wherein the diffusion region of the first FET, the diffusion region of the last FET and the at least one floating diffusion are provided in fins composed of the substrate material.

18. The structure of claim 9, wherein only the first contact and the second contact are in contact with diffusion regions of the multiple FET devices and the floating diffusion regions are devoid of trench silicide and trench contacts.

19. A structure comprising:
a first FET having an epitaxial diffusion region connecting to a voltage supply;
a second FET having an epitaxial diffusion region connected to ground;
at least one additional FET connecting in series with the first FET and the second FET and having floating nodes devoid of any contacts;
a first contact connecting the epitaxial diffusion region of the first FET to the voltage supply; and
a second contact connecting the epitaxial diffusion region of the second FET to the ground,
wherein the floating nodes of the at least one additional FET comprises floating diffusion regions devoid of contacts between the first contact and the second contact.

* * * * *